United States Patent [19]
Hibino et al.

[11] Patent Number: 5,581,875
[45] Date of Patent: Dec. 10, 1996

[54] METHOD OF MANUFACTURING CIRCUIT MODULE

[75] Inventors: Eiichi Hibino; Yoji Maeda; Sadao Kotera; Kazunori Kinoshita, all of Kyoto, Japan

[73] Assignee: Murata Manufacturing Co., Ltd., Japan

[21] Appl. No.: 389,485

[22] Filed: Feb. 16, 1995

[30] Foreign Application Priority Data

Feb. 18, 1994 [JP] Japan ..................... 6-020926

[51] Int. Cl.⁶ ............... H05K 3/34; H05K 7/14
[52] U.S. Cl. ............... 29/840; 29/837; 29/843; 29/845; 174/255; 228/180.1; 361/753
[58] Field of Search ............... 29/837, 840–845, 29/DIG. 3, DIG. 21; 174/52.1, 255, 257, 260; 228/180.1, 180.21, 180.22; 257/696, 699, 711, 731; 361/728, 736, 752, 753, 761, 829

[56] References Cited

U.S. PATENT DOCUMENTS

| | | | |
|---|---|---|---|
| 4,809,057 | 2/1989 | Ocken | 361/728 X |
| 5,085,362 | 2/1992 | Art et al. | 29/840 X |
| 5,088,190 | 2/1992 | Malhi et al. | 29/843 |
| 5,184,283 | 2/1993 | Hamel | 361/736 |
| 5,408,207 | 4/1995 | Chanteau | 361/753 X |

FOREIGN PATENT DOCUMENTS

| | | | |
|---|---|---|---|
| 59-825 | 4/1985 | Japan | 29/843 |
| 124759 | 5/1994 | Japan | 29/842 |

*Primary Examiner*—Peter Vo
*Attorney, Agent, or Firm*—Ostrolenk, Faber, Gerb & Soffen, LLP

[57] ABSTRACT

An electronic component is mounted on one major surface of a dual side wiring substrate. A terminal is press-fitted into a mounting hole in the dual side wiring substrate from the one major surface side to be temporarily fixed in the substrate, and an electronic component is mounted on the other major surface of the dual side wiring substrate after soldering paste is applied. A frame having a plurality of bent pieces extending inwardly is mounted onto the dual face wiring substrate from a position above the substrate so that the bent pieces abut against the pattern of the dual side wiring substrate. The terminal press-fitted from the one major surface side, the electronic component mounted on the other major surface, and the frame are soldered simultaneously by a reflow method.

6 Claims, 5 Drawing Sheets

FIG. 1    PRIOR ART

```
┌─────────────────────────────────────┐
│ MOUNT ELECTRONIC COMPONENT ON       │
│ ONE FACE OF DUAL SIDE WIRING        │
│ SUBSTRATE                           │
└─────────────────────────────────────┘
                  │
┌─────────────────────────────────────┐
│ SOLDERING BY REFLOW                 │
└─────────────────────────────────────┘
                  │
┌─────────────────────────────────────┐
│ MOUNT ELECTRONIC COMPONENT ON       │
│ OTHER FACE OF DUAL SIDE WIRING      │
│ SUBSTRATE                           │
└─────────────────────────────────────┘
                  │
┌─────────────────────────────────────┐
│ SOLDERING BY REFLOW                 │
└─────────────────────────────────────┘
                  │
┌─────────────────────────────────────┐
│ ATTACH TERMINAL TO DUAL SIDE        │
│ WIRING SUBSTRATE                    │
└─────────────────────────────────────┘
                  │
┌─────────────────────────────────────┐
│ SOLDERING BY SOLDERING IRON         │
└─────────────────────────────────────┘
                  │
┌─────────────────────────────────────┐
│ ATTACH FRAME TO DUAL SIDE WIRE      │
│ SUBSTRATE                           │
└─────────────────────────────────────┘
                  │
┌─────────────────────────────────────┐
│ SOLDERING BY SOLDERING IRON         │
└─────────────────────────────────────┘
```

METHOD OF MANUFACTURING CIRCUIT MODULE

BACKGROUND OF THE INVENTION

1. Field of the Invention

The present invention relates to a method of manufacturing circuit modules. More particularly, the present invention relates to a method of manufacturing a circuit module having a frame soldered to a circuit substrate on which electronic components are mounted and terminals are soldered.

2. Description of the Prior Art

A circuit module such as an electronic tuner has a shield metal frame soldered along the periphery of a side surface of a dual side wiring substrate having an electronic component mounted on either side and terminals soldered thereon. Such a circuit module is formed according to the procedure shown in FIG. 1.

First, electronic components are mounted on one surface of a dual side wiring substrate. The electronic components are soldered by a reflow method to obtain high density. Then, electronic components are mounted on the other surface and soldered by a reflow method. Next, a terminal is connected in a mounting hole of the dual side wiring substrate, and the terminal is soldered by a soldering iron. Then, a frame for shielding is attached to the dual side wiring substrate along the side surface perimeter thereof and then soldered by a soldering iron. Finally, a cover is fitted above and below the shield frame.

This conventional manufacturing method has many processing steps. More specifically, in addition to the step of mounting electronic components onto each side of the dual side wiring substrate, the steps of soldering a terminal to the dual side wiring substrate and soldering the frame to the side surface of the wiring substrate are necessary. There is also a problem that soldering drops and flux are spattered during the soldering process thereby causing secondary defects. In a manufacturing method where a soldering iron is used, the soldering work is very difficult if there are electronic components near the portion which is to be soldered. Therefore, dead space is found at the periphery of the soldering portion, which inhibits increasing the packaging density.

SUMMARY OF THE INVENTION

In view of the foregoing, a main object of the present invention is to provide a method of manufacturing a circuit module that has a reduced number of processing steps improves, productivity, and increases package density without causing secondary defects.

The present invention relates to a method of manufacturing a circuit module having a circuit substrate mounted with a plurality of electronic components and terminals attached to a frame of a configuration along the side periphery of the circuit substrate. According to the manufacturing method, a plurality of side surface portions of the frame are bent inwardly to form bent pieces. A circuit pattern for electrically connecting the plurality of electronic components and a mounting hole for attaching a terminal are formed in the circuit substrate. A fluid conductive member is printed at each pattern of the circuit substrate. Also, the plurality of electronic components are mounted, and a terminal is temporary fixed in a mounting hole. By abutting the bent piece of the frame against the circuit substrate, the frame is mounted an the circuit substrate. The printed fluid conductive member is heated to be melted. The electronic components and the terminal are fixed to corresponding patterns simultaneously.

According to the present invention, the electronic components and the terminal can be attached to the circuit substrate simultaneously. Therefore, the number of processing steps can be reduced to improve productivity.

In a preferred embodiment, a circuit pattern is formed on one major surface and the other major surface of the circuit substrate. A fluid conductive member is printed on each pattern on one major surface, and a plurality of electronic components are mounted, followed by heating of the fluid conductive member. Therefore, the plurality of electronic components are bonded to the one major surface of the circuit substrate. Then, a fluid conductive member is printed on the other major surface, and electronic components are mounted on the circuit pattern. A terminal is temporarily fixed in a mounting hole, followed by heating of the fluid conductive member. As a result, the electronic components and terminals are attached simultaneously onto the other major surface of the circuit substrate.

Since electronic components are attached to one major surface and the other major surface of the circuit substrate, the integration density can be improved.

In a more preferable embodiment, a connecting pattern is formed at a position on the other major surface of the circuit substrate where the bent piece abuts. A fluid conductive member is printed on the connecting pattern. In the heating step, the bent piece of the frame is fixed to the corresponding pattern together with the electronic components and terminals.

According to the present embodiment, the electronic components, terminals, and the frame can be simultaneously attached to the circuit substrate.

In a further preferable embodiment, a through hole is formed in a mounting hole. A terminal has a brim-like portion formed at one end and a plurality of expansions having the tip of the brim-like portion extending outwardly. The frame has a rectangular body extending along the side surface perimeter of the circuit substrate. A bent piece is bent inwardly at substantially right angles to each rectangular piece.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows the procedure of a conventional manufacturing method of a circuit module.

DESCRIPTION OF THE PREFERRED EMBODIMENTS

Figure 2:
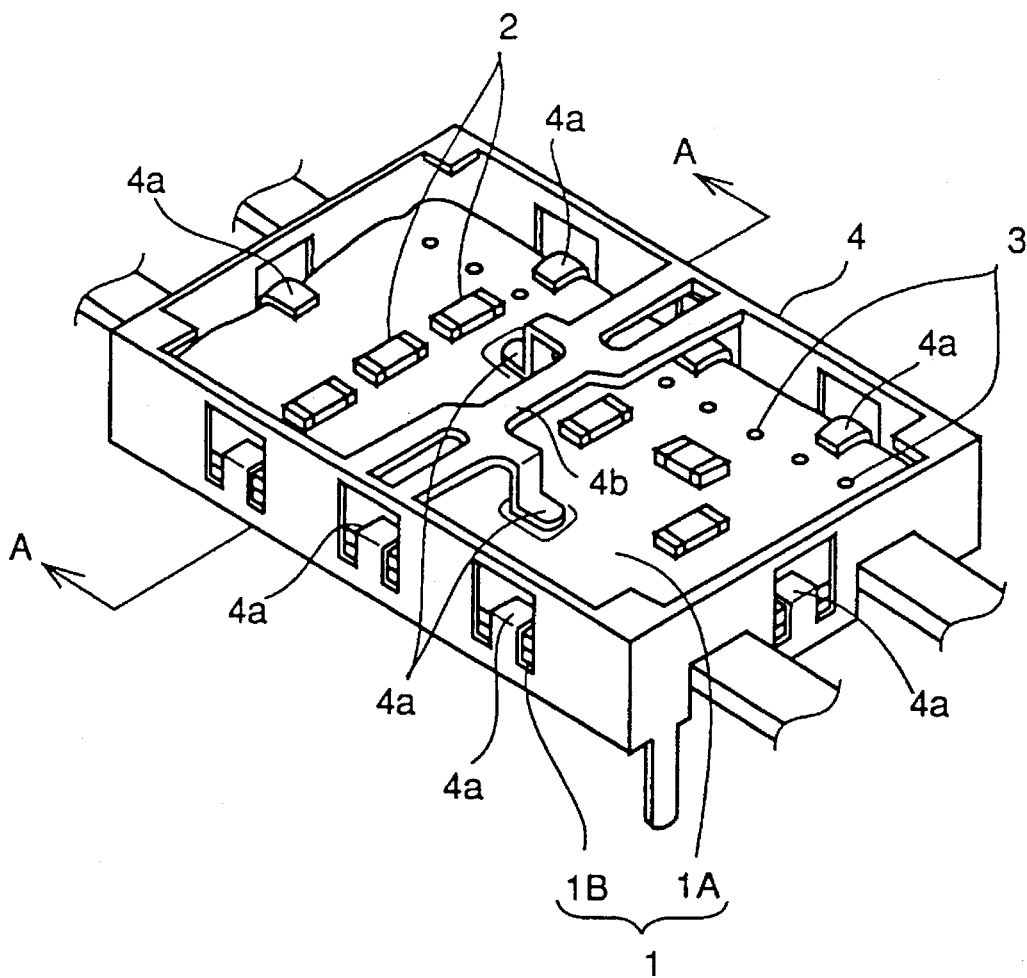
FIG. 2 is a perspective view of a circuit module to which a method according to an embodiment of the present invention is applied.
Figure 3:
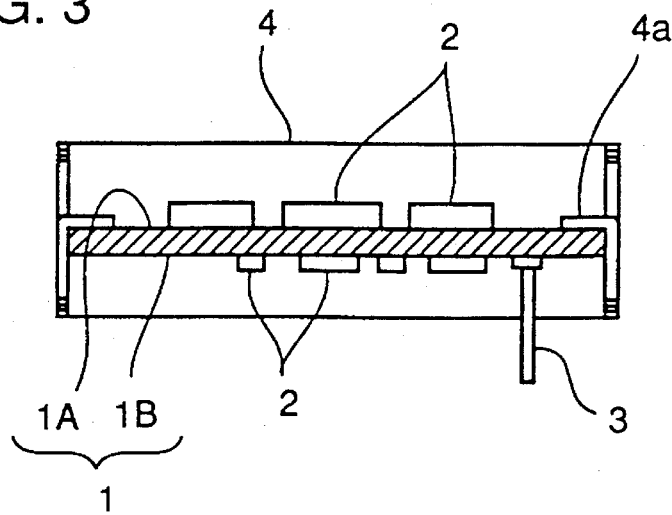
FIG. 3 is a sectional view of FIG. 2 taken along line A—A.

FIG. 2 is a perspective view of a circuit module manufactured according to a method of the present invention, and FIG. 3 is a sectional view taken along lines A—A of FIG. 2.

According to a circuit module of the present embodiment, an electronic component 2 is mounted on both major surfaces 1A and 1B of a dual side wiring substrate 1 having a conductor pattern (not shown) formed on both sides. A terminal 3 and a metal frame 4 for shielding are soldered to dual side wiring substrate 1.

Figure 4A:
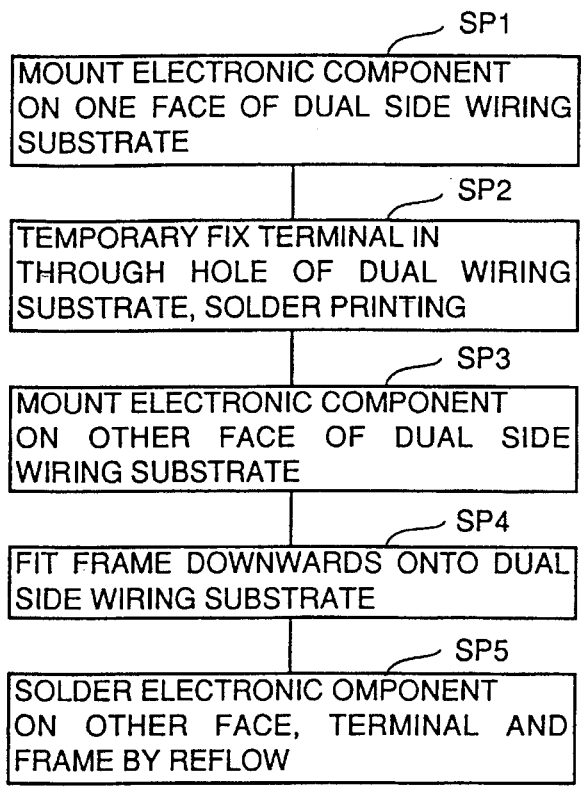
FIG. 4A is a diagram for describing the steps of the embodiment shown in FIG. 2.
Figure 4B:
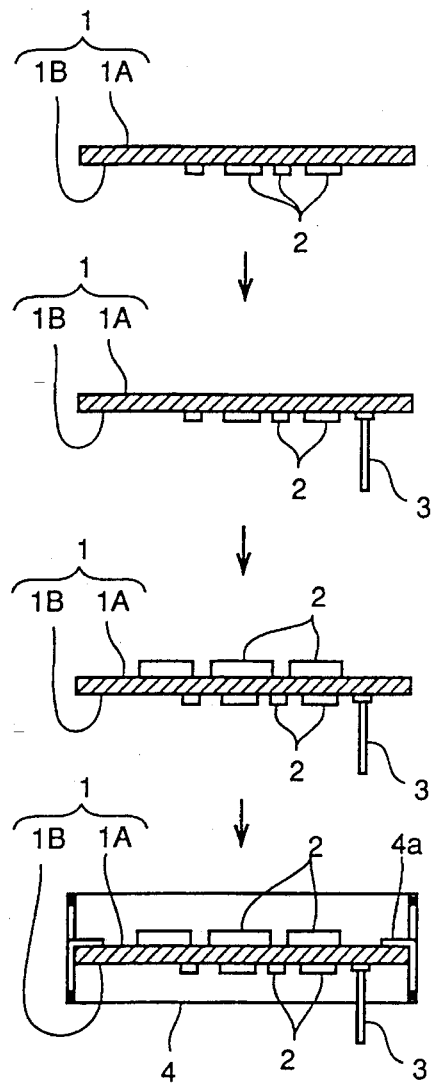
FIG. 4B shows sectional views of the circuit substrate corresponding to each step of FIG. 4A.
Figure 5:
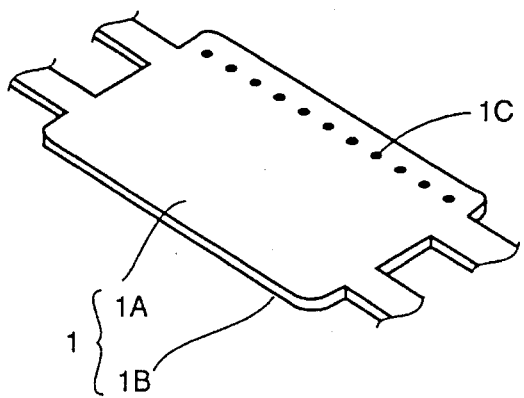
FIG. 5 is a perspective view of a dual side wiring substrate.
Figure 6:
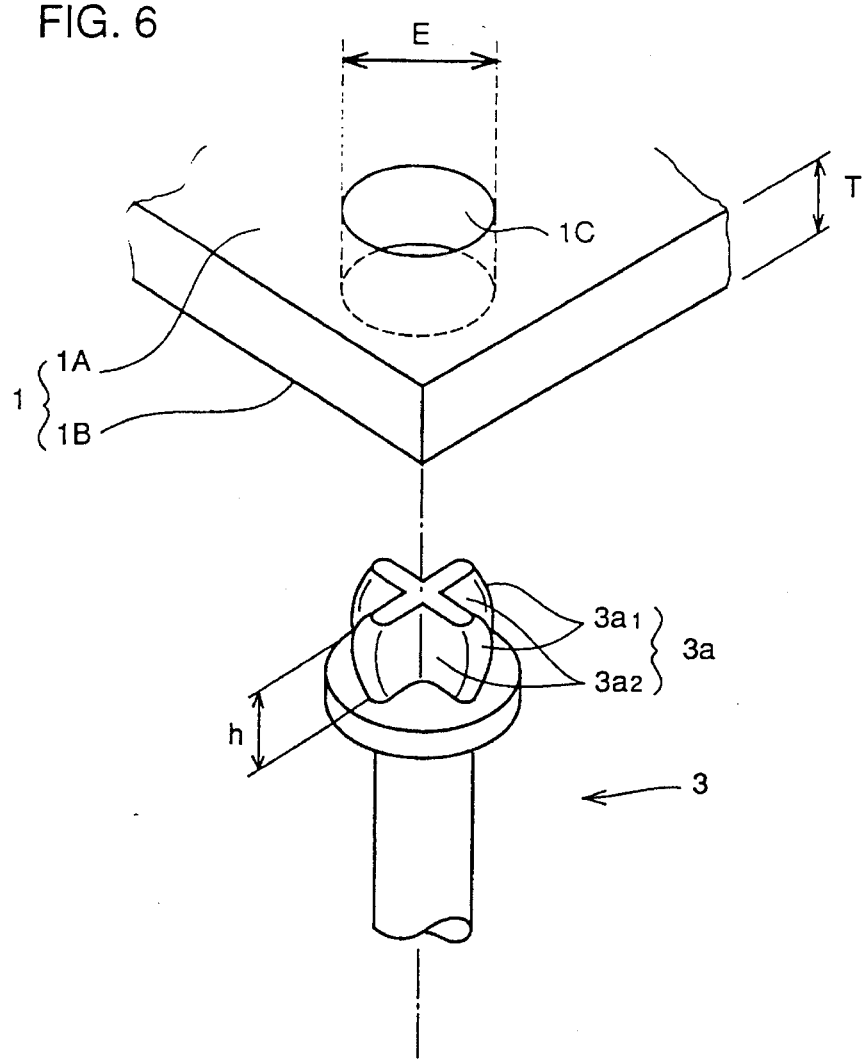
FIG. 6 is a perspective view of a dual side wiring substrate and a terminal.
Figure 7:
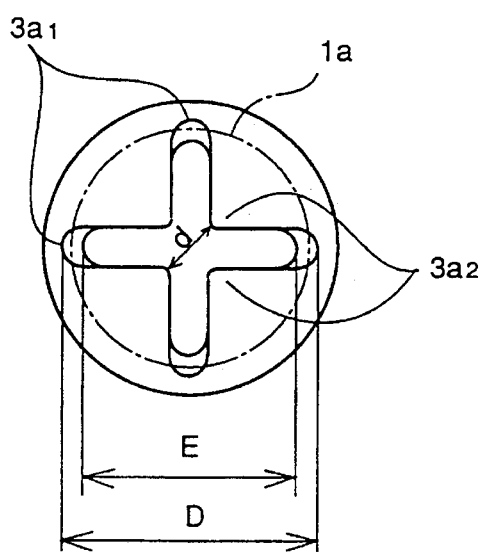
FIG. 7 is a plan view of a terminal.

FIG. 4A is a diagram for describing the steps of an embodiment of the present invention; FIG. 4B is a sectional view of a dual side wiring substrate corresponding to each step of FIG. 4A; FIG. 5 is a perspective view of a dual side wiring substrate; FIG. 6 is a perspective view of a dual side wiring substrate and a terminal; and FIG. 7 is a plan view of a terminal.

In a step SP1 of FIG. 4A ("step" is abbreviated as SP in the drawing), similar to a conventional method, a conductor pattern is formed on one major surface 1B and the other major surface 1A of dual side wiring substrate 1 shown in FIG. 5. Soldering paste is printed on the one major surface 1B, followed by the mounting of electronic components, and then subjected to heating. Thus, the soldering paste is melted. As a result of the so-called reflow soldering, electronic component 2 is soldered.

At step SP2, terminal 3 is temporarily fixed to a through hole 1C of dual side wiring substrate 1 of FIG. 5. Soldering paste is printed on the major surface 1A of dual side wiring substrate 1. Terminal 3 is temporarily fixed as follows. More specifically, as shown in the partially enlarged view of FIG. 6, terminal 3 is a cylindrical terminal with a brim. Terminal 3 includes a connecting portion 3a that is inserted into a through hole 1C from one major surface 1B of dual side wiring substrate 1 to be soldered. Connecting portion 3a includes four extrusions $3a_1$ extending outwardly and four dent portions $3a_2$ recessed inwardly. As shown in the plan view of FIG. 7, the extrusion $3a_1$ is less wide at the tip of connecting portion 3a and gradually increasingly wide in the direction of length thereof (downwards in FIG. 6). The width of extrusion $3a_1$ is greatest at the vicinity of the center, and is then gradually reduced again. The outside diameter D of expansion $3a_1$ of this maximum portion is slightly greater than the diameter E of through hole 1C. The outside diameter d of dent portion $3a_2$ is sufficiently smaller than the diameter E of through hole 1C.

Terminal 3 of the above-described structure is press-fitted into through hole 1C of dual side wiring substrate 1, whereby the expansion $3a_1$ contacts the inner wall of through hole 1C so that the terminal 3 temporarily fixed with no offset of its position and inclination. A gap is provided between dent portion $3a_2$ and the inner wall of through hole 1C to which solder flows. This gap is filled with soldering paste printed on the other major surface 1A.

Connecting portion 3a has a length h which is less than the thickness T of dual side wiring substrate 1 plus the thickness of the mask for printing soldering paste. Therefore, the tip of connecting portion 3 will not protrude from the mask face when connecting portion 3a is press-fitted into through hole 1C of dual side wiring substrate 1, followed by provision of soldering paste with a squeegee via the mask.

Referring to FIG. 4 again, at step SP3, electronic component 2 is mounted on the other major surface 1A of dual side wiring substrate 1 on which terminal 3 is temporarily fixed and soldering paste printed. Frame 4 is fitted from a position above dual side wiring substrate 1.

Frame 4 includes a rectangular body extending along the side periphery of dual side wiring substrate 1. This frame body has a plurality of pieces 4a bent inwardly at substantially right to the frame body. A joint portion 4b is provided between the upper edges of the pair of the opposing long side portions of the frame in the vicinity of the center thereof. This joint portion 4b also has a bent piece 4a thereon. Frame 4 is mounted to dual-side wiring substrate 1 by abutting bent piece 4a against the pattern formed on the other major surface 1a of dual side wiring substrate 1. In the present embodiment, the area of the pattern of dual side wiring substrate 1 is made slightly greater than the area of bent piece 4a in order to improve the soldering strength and to facilitate visual checking after soldering.

Figure 8A:
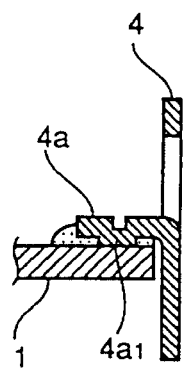
FIG. 8A is a sectional view showing an enlargement around the bent piece shown in FIG. 2.
Figure 8B:
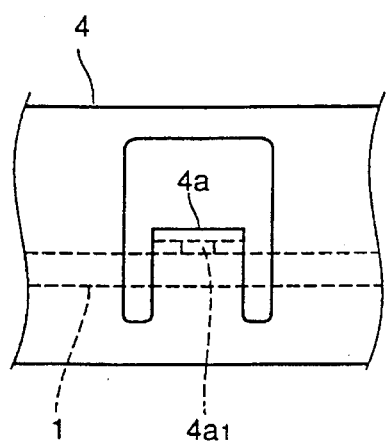
FIG. 8B shows an enlargement around the bent piece of FIG. 2.

FIG. 8A is an enlarged sectional view in the proximity of a bent piece 4a where frame 4 is mounted onto dual-side wiring substrate 1; and FIG. 8B is an enlarged view of the outer appearance of the bent piece.

In the present embodiment, bent piece 4a is bent downwards with a notch of an inverse concave shape located at the side surface of the frame body. Bent piece 4a is formed so as to extend inwardly from frame 4. For the purpose of forming a gap for soldering, a protrusion $4a_1$ is formed to extend towards dual side wiring substrate 1 at approximately the middle of bent piece 4a.

Figure 9A:
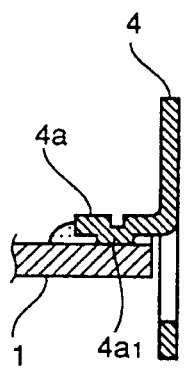
FIG. 9A is a sectional view corresponding to FIG. 8A according to another embodiment of the present invention.
Figure 9B:
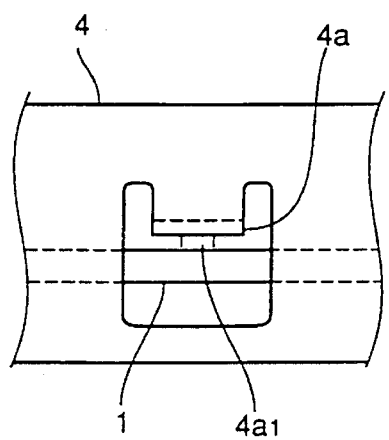
FIG. 9B is an enlargement view corresponding to FIG. 8B according to another embodiment of the present invention.
Figure 10:
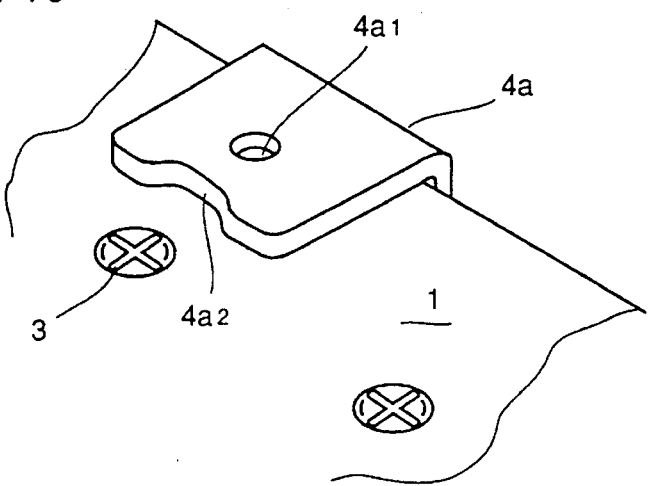
FIG. 10 is a perspective view of a bent piece according to another embodiment of the present invention.

FIG. 9A and 9B are enlarged views of bent piece 4a showing another embodiment of the present invention. In the embodiment shown in FIGS. 9A and 9B, bent piece 4a is bent upwardly and has with a notch of a concave in the frame body. Bent piece 4a is formed so as to extend inwardly from frame 4.

When there is a possibility of shorting occurring between bent piece 4a and another electronic component, for example, terminal 3, which is located in close proximity with bent piece 4a, a notch $4a_2$ may be formed in bent piece 4a in the proximity of terminal 3 to ensure separation therebetween.

Referring to FIG. 3 again, at step SP5, after frame 4 is mounted on dual side wiring substrate 1, the soldering paste printed on the other face 1A is heated and melted. Terminal 3 press-fitted from the side of the one major surface 1B, electronic component 2 mounted on the other major surface 1A, and frame 4 are all soldered simultaneously, to result in the state shown in FIG. 3. Then, a cover (not shown) is fitted from above and below frame 4.

Since terminal 3 press-fitted from the one major surface 1B side of wiring substrate 1, electronic component 2 abutted against the other major surface 1A, and frame 4 are soldered simultaneously by a reflow method, the number of manufacturing steps is reduced to improve the productivity in comparison with the conventional method in which terminal 3 and frame 4 are soldered using a soldering iron.

Also, the method of the present invention avoids secondary defects caused by spattering of solder drops and flux as in the conventional case where terminal 3 and frame 4 are soldered using a soldering iron. Furthermore, the dead space around the portion to be soldered is eliminated, allowing a greater package density.

Since a predetermined bent piece of the plurality of bent pieces 4a is soldered in a manner abutting against the earth pattern of the other major surface 1A of dual side wiring substrate 1, the earth of the circuit can be commonly established by bent piece 4a of frame 4.

Although a shield plate that partitions the internal spacing is not provided in frame 4 in the present embodiment, it may be formed if necessary as another embodiment. However, it is to be noted that such a shield plate is desirably minimized since it can be the cause of preventing uniform heating during reflow.

In the above-described embodiments, the present invention is applied to a dual side wiring substrate 1 having a conductor pattern at opposite sides. The present invention is not limited to the above-described embodiment, and may be applied to a wiring substrate having a conductor pattern formed only on one major surface thereof, or to a multilayer wiring substrate having a conductor pattern formed in the inner major surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a circuit module having a circuit substrate including a plurality of electronic components and a terminal mounted thereon, the circuit module being attached to a frame along a side periphery of said circuit substrate, said method comprising the steps of:

forming a plurality of bent pieces extending inwardly from side surface portions of said frame;

forming a plurality of circuit patterns for electrically connecting said plurality of electronic components and a mounting hole for attaching said terminal in said circuit substrate;

printing a fluid conductive member at each of said circuit patterns located on said circuit substrate, and mounting said plurality of electronic components onto said circuit substrate;

temporarily fixing said terminal in said mounting hole of said circuit substrate;

installing said frame on said circuit substrate by abutting said bent pieces of said frame against said circuit substrate; and heating and melting said printed fluid conductive member to simultaneously fix said plurality of electronic components and said terminal to corresponding circuit patterns.

2. The method of manufacturing a circuit module according to claim 1, further comprising the steps of:

forming a circuit pattern on each of a first major surface and a second major surface of said circuit substrate;

printing a fluid conductive member at each pattern on said first major surface of said circuit substrate, and mounting said plurality of electronic components on said first major surface;

wherein said step of forming a pattern comprises the step of forming said circuit pattern and said mounting hole on said second major surface of said circuit substrate.

3. The method of manufacturing a circuit module according to claim 2, wherein a connecting pattern is formed at a portion where one of said bent pieces abuts on said second major surface of said circuit substrate, a fluid conductive member is printed on said connecting pattern, said one bent piece being fixed to a corresponding pattern at the same time that said electronic components and said terminal are fixed to said corresponding pattern.

4. The method of manufacturing a circuit module according to claim 1, wherein a through hole is formed in said mounting hole.

5. The method of manufacturing a circuit module according to claim 1, wherein said terminal has a brim portion at one end and a plurality of expanding members in which the edges of said brim portion extends outwardly.

6. The method of manufacturing a circuit module according to claim 1, wherein said frame comprises a rectangular body extending along a side periphery of said circuit substrate, wherein each of said bent pieces is bent inwardly at substantially right angles to said rectangular body.

* * * * *